(12) United States Patent
Chang

(10) Patent No.: US 12,744,097 B2
(45) Date of Patent: Sep. 22, 2026

(54) SEMICONDUCTOR DEVICE AND METHOD OF MANUFACTURING THE SAME

(71) Applicant: Taiwan Semiconductor Manufacturing Company, Ltd., Hsinchu (TW)

(72) Inventor: Meng-Sheng Chang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 362 days.

(21) Appl. No.: 18/526,278

(22) Filed: Dec. 1, 2023

(65) Prior Publication Data

US 2025/0069677 A1 Feb. 27, 2025

Related U.S. Application Data

(60) Provisional application No. 63/520,821, filed on Aug. 21, 2023.

(51) Int. Cl.

*G11C 17/16* (2006.01)
*H10B 20/00* (2023.01)
*H10B 20/25* (2023.01)
*H10D 30/68* (2025.01)

(52) U.S. Cl.

CPC ............. *G11C 17/16* (2013.01); *H10B 20/25* (2023.02); *H10B 20/60* (2023.02); *H10D 30/681* (2025.01)

(58) Field of Classification Search

CPC ........ G11C 17/16; G11C 17/18; H10B 20/25; H10B 20/60; H10B 41/35; H10B 41/27; H10B 41/41; H10D 30/681

See application file for complete search history.

(56) References Cited

U.S. PATENT DOCUMENTS

| | | | | |
|---|---|---|---|---|
| 12,075,614 | B2 * | 8/2024 | Chang | H10B 20/20 |
| 2017/0221910 | A1 | 8/2017 | Chen et al. | |
| 2020/0075610 | A1 * | 3/2020 | Wu | G11C 17/18 |
| 2022/0068413 | A1 | 3/2022 | Su et al. | |

(Continued)

FOREIGN PATENT DOCUMENTS

| | | |
|---|---|---|
| TW | 202312176 A | 3/2023 |
| TW | 202329102 A | 7/2023 |

OTHER PUBLICATIONS

Office Action issued in connection with Taiwan Appl. No. 113115164 dated Feb. 12, 2025.

*Primary Examiner* — Allison Bernstein

(74) *Attorney, Agent, or Firm* — Foley & Lardner LLP

(57) ABSTRACT

A memory device includes peripheral transistors formed along a first surface of a substate; memory cells formed in one or more of first metallization layers disposed over the first surface, each of the memory cells being operatively coupled to a subset of the peripheral transistors and including a programming transistor and at least a first reading transistor; and second metallization layers disposed over a second surface of the substrate opposite to the first surface. A first source/drain terminal of the first reading transistor is in electrical connection with a first source/drain terminal of the programming transistor. A second source/drain terminal of the first reading transistor is in electrical connection with a bit line that is formed in a corresponding one of the second metallization layers.

20 Claims, 14 Drawing Sheets

(56) References Cited

U.S. PATENT DOCUMENTS

| | | | | |
|---|---|---|---|---|
| 2022/0336480 | A1 | 10/2022 | Su et al. | |
| 2023/0064751 | A1* | 3/2023 | Chang | G11C 17/16 |
| 2023/0067140 | A1* | 3/2023 | Chen | G06F 30/392 |
| 2025/0070018 | A1* | 2/2025 | Yang | G11C 17/18 |
| 2025/0070053 | A1* | 2/2025 | Chen | H10B 20/25 |

* cited by examiner

SEMICONDUCTOR DEVICE AND METHOD OF MANUFACTURING THE SAME

CROSS-REFERENCE TO RELATED APPLICATION

This application claims priority to and the benefit of U.S. Provisional Application No. 63/520,821, filed Aug. 21, 2023, entitled "ANTI-FUSE MACRO WITH IGZO IN SPR PROCESS," which is incorporated herein by reference in its entirety for all purposes.

BACKGROUND

Developments in electronic devices, such as computers, portable devices, smart phones, internet of thing devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
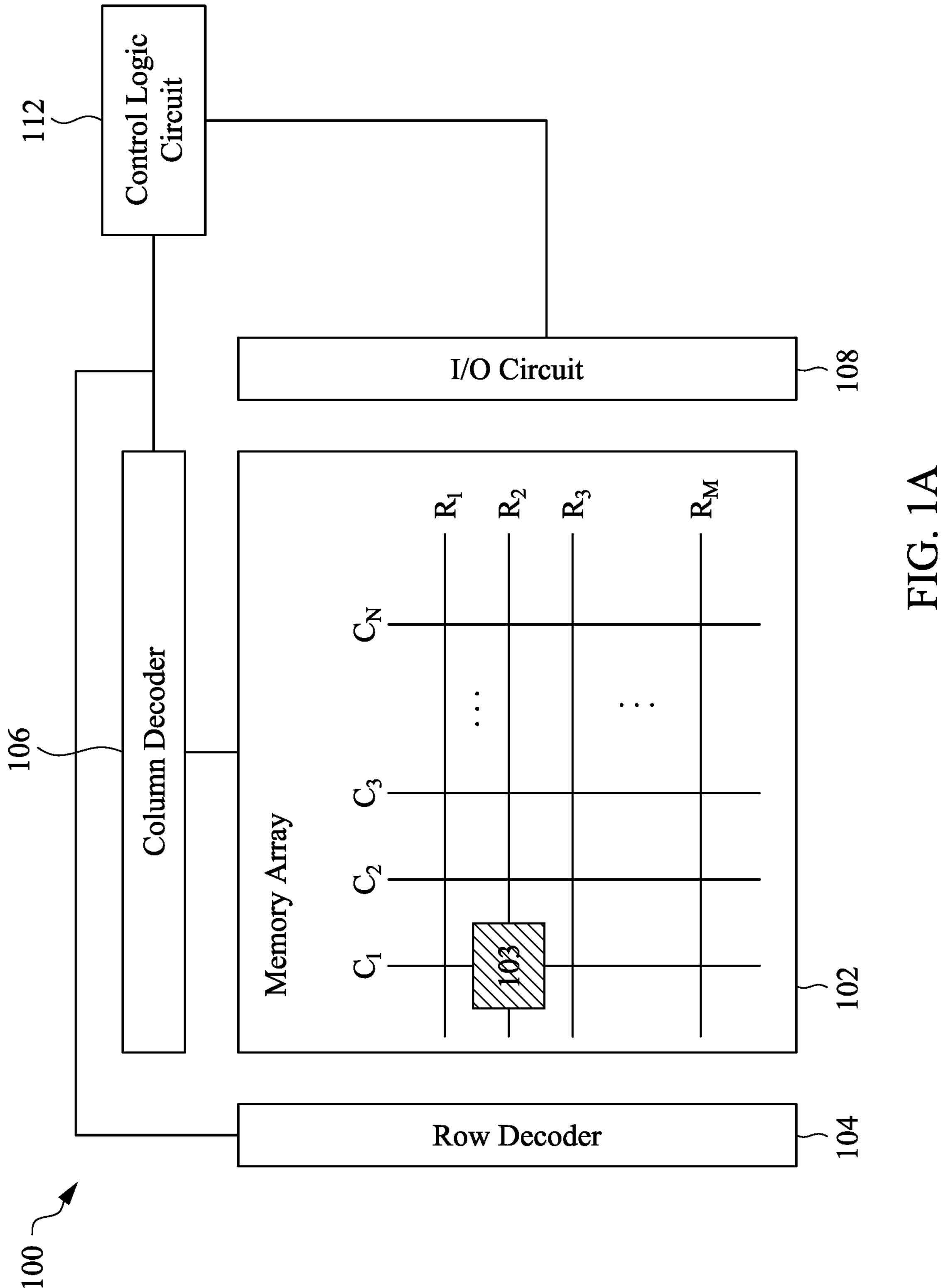
FIG. 1A illustrates an example block diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs) sometimes include one-time-programmable (OTP) memories to provide non-volatile memory (NVM) in which data are not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor coupled in series. A gate dielectric of the programming MOS transistor may be broken down to cause the gate and the source or drain of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantageous features of reverse-engineering proofing since the programming states of the anti-fuse cells cannot be determined through reverse engineering.

Embodiments of the present disclosure provide various embodiments of a memory device that includes a plurality of peripheral transistors formed along a first surface of a substate, a plurality of memory cells formed in one or more of a plurality of first metallization layers disposed over the first surface, and a plurality of second metallization layers disposed over a second surface of the substrate opposite to the first surface. Each of the plurality of memory cells includes a programming transistor and at least one reading transistor, is operatively coupled to a subset of the peripheral transistors, and serves as an anti-fuse memory cell, in which a gate dielectric of the programming transistor is configured to be permanently broken down after being programmed. A source/drain terminal of the reading transistor is in electrical connection with a source/drain terminal of the programming transistor, and another source/drain terminal of the reading transistor is in electrical connection with a bit line formed in one of the second metallization layers. With various combinations of different types of transistors in each memory cell, and stacked arrangements of the memory cells relative to the peripheral transistors and the bit lines, the memory device can advantageously have reduced area and increased reading speed, thereby advantageously leading to compacter chip design and more robust chip performance.

FIG. 1A illustrates an example block diagram of a memory device 100 in accordance with some embodiments. In the illustrated embodiment of FIG. 1A, the memory system 100 includes a memory array 102, a row decoder 104, a column decoder 106, an input/output (I/O) circuit 108, and a control logic circuit 112. Despite not being shown in FIG. 1A, all of the components of the memory system 100 may be coupled to each other and to the control logic circuit 112. Although, in the illustrated embodiment of FIG. 1A, each component is shown as a separate block for the purpose of clear illustration, in some other embodiments, some or all of the components shown in FIG. 1A may be integrated together.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1$, $R_2$, $R_3$ . . . $R_M$, each extending in a first direction (e.g., X-direction) and a number of columns $C_1$, $C_2$, $C_3$ . . . $C_N$, each extending in a second direction (e.g., Y-direction). Each of the rows/columns may include one or more conductive structures function as access lines.

In some embodiments, each memory cell 103 is arranged in the intersection of a corresponding row and a corresponding column, and can be operated according to voltages or currents through the respective conductive structures of the row and column. In some embodiments, each memory cell 103 is embodied as an anti-fuse memory cell including a programming transistor, and one or more reading transistors. Details about the anti-fuse memory cells 103 (e.g., 103A) will be discussed below with respect to FIGS. 2A, 2B and 2C.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a pair of source lines) at that column address. The I/O circuit 108 is a hardware component that can access (e.g., read or program) each of the memory cells 103 asserted through the row decoder 104 and column decoder 106. The control logic circuit 112 is a hardware component that can control the coupled components (e.g., 102 through 108).

Figure 1B:
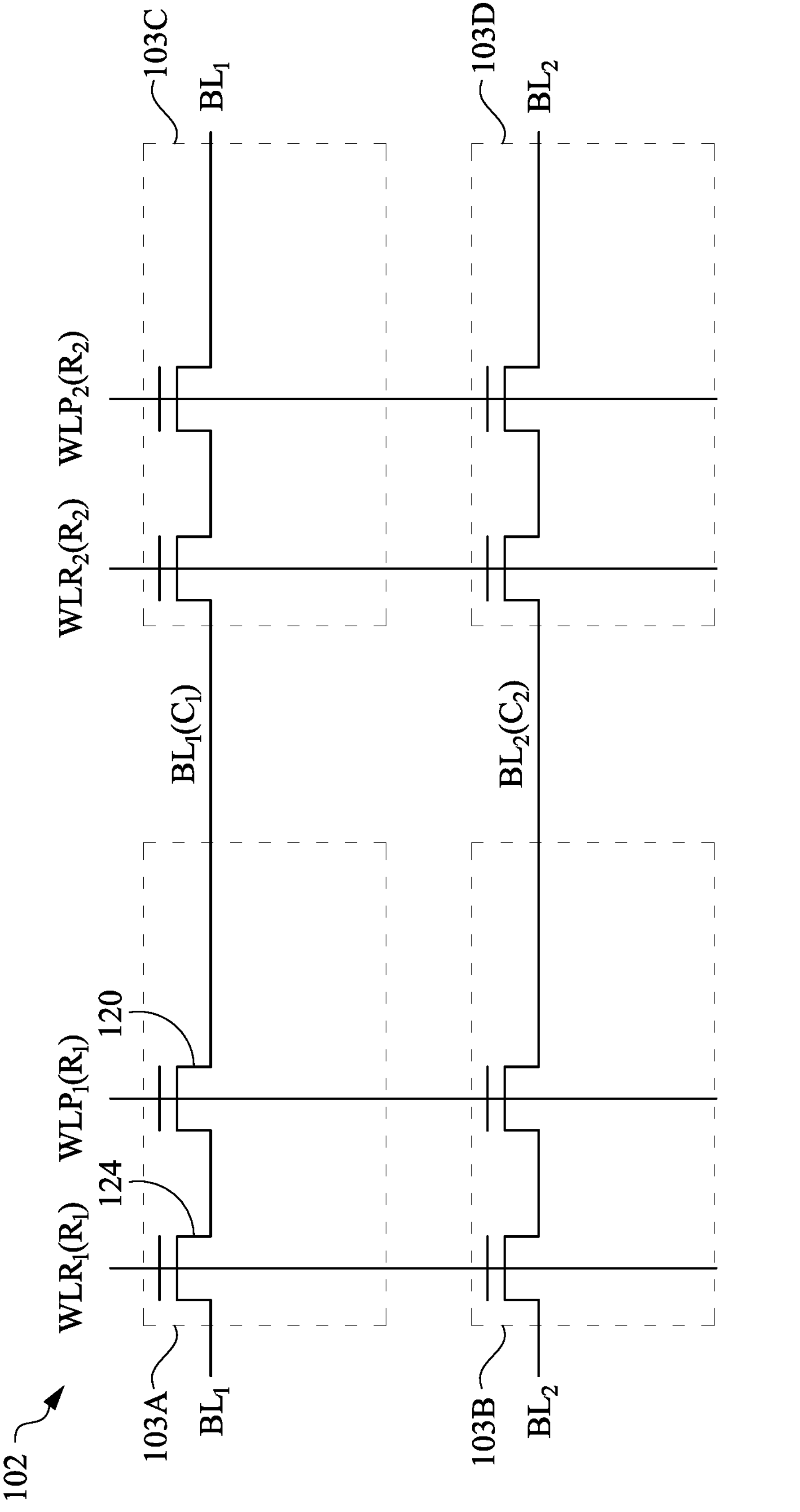
FIG. 1B illustrates an example circuit diagram of a portion of the memory device of FIG. 1A in accordance with some embodiments.

FIG. 1B illustrates an example circuit diagram of a portion of the memory device 100 (e.g., some of the memory cells 103) in accordance with some embodiments. In FIG. 1B, anti-fuse memory cells 103A, 103B, 103C and 103D of the memory array 102 of FIG. 1A are shown, however it should be appreciated that the memory array 102 can have any number of anti-fuse memory cells 103, while remaining within the scope of present disclosure.

As mentioned above, the memory cells 103 can be arranged as an array. In FIG. 1B, the memory cells 103A and 103B may be disposed in a same row but in respectively different columns; and the memory cells 103C and 103D may be disposed in a same row but in respectively different columns. For example, the memory cells 103A and 103B are disposed in row $R_1$, but in different columns $C_1$ and $C_2$, respectively; and the memory cells 103C and 103D are disposed in row $R_2$, but in different columns $C_1$ and $C_2$, respectively. With such a configuration, each of the memory cells can be operatively coupled to the access lines in the corresponding row and column, respectively.

In some embodiments, each of the memory cells 103A to 103D can be operatively coupled to the I/O circuit 108 through the respective WLR, WLP, and BL for being accessed (e.g., programmed, read). For example, the I/O circuit 108 can cause the row decoder 104 to assert the $WLP_1$ and $WLR_1$ and the column decoder 106 to assert the $BL_1$ so as to access the memory cell 103A. Accordingly, each of the memory cells 103A to 103D can be individually selected to be programmed or read. Details of programming and reading the memory cell will be discussed in further detail below.

Each of the memory cells 103A to 103D includes a programming transistor and at lease one reading transistor coupled in series. In each memory cell, the programming transistor is gated by a WLP, and the at least one reading transistor is gated by a WLR, in accordance with various embodiments. As shown in FIG. 1B, for example, a memory cell 103A includes a programming transistor 120 gated by a $WLP_1$ and a reading transistor 124 gated by a $WLR_1$. Memory cell 103A is selected as a representative example in the following discussions.

Figure 2A:
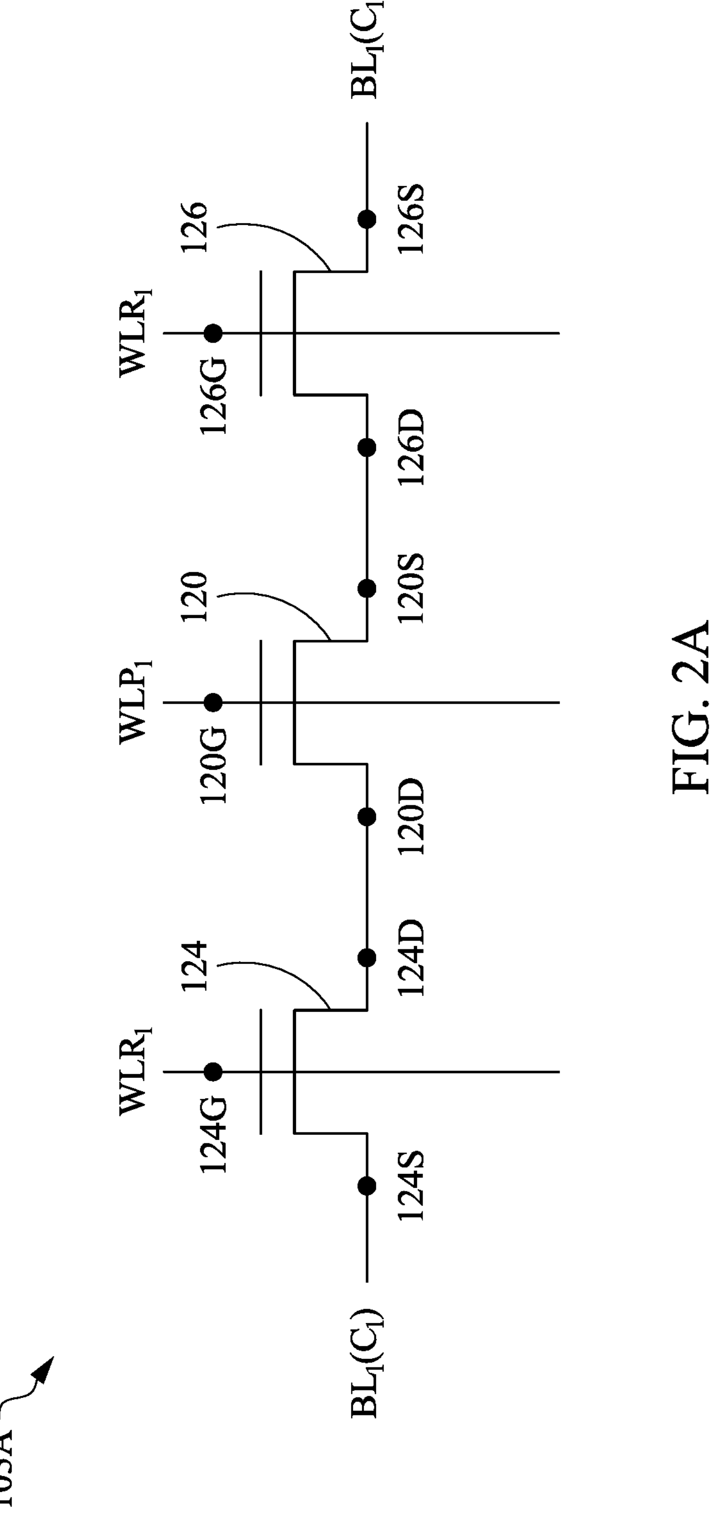
FIG. 2A illustrates an example circuit diagram of an anti-fuse memory cell of the memory device of FIGS. 1A and 1B in accordance with some embodiments.

FIG. 2A illustrates an example circuit diagram of an anti-fuse memory cell 103A of the memory device of FIGS. 1A and 1B in accordance with some embodiments. Each of other memory cells (e.g., 103B, 103C, 103D in FIG. 1B) can be configured substantially similar to the memory cell 103A. In some embodiments, the anti-fuse memory cell 103A is implemented as a three-transistor (3T) symmetric configuration, and includes a programming transistor 120, a first reading transistor 124, and a second reading transistor 126, in which the programming transistor 120 is electrically coupled between the first reading transistor 124 and the second reading transistor 126 in series.

As shown in FIG. 2A, in some embodiments, a source/drain terminal 120D of the programming transistor 120 is coupled to a source/drain terminal 124D of the first reading transistors 124, and the other source/drain terminal 120S of the programming transistor 120 is coupled to a source/drain terminal 126D of the second reading transistor 126. In some embodiments, the source/drain terminal 124S of the first reading transistor 124 and the source/drain terminal 126S of the second reading transistors 126 are commonly coupled to a bit line $BL_1$.

Also as shown in FIG. 2A, in some embodiments, the programming transistor 120 is gated by the $WLP_1$. The first and the second reading transistors 124 and 126 are commonly gated by the $WLR_1$ respectively via gate terminals 124G and 126G of the reading transistors 124 and 126. However, it should be understood that the gate terminals of the reading transistors may be coupled to respective different WLRs.

Figure 2B:
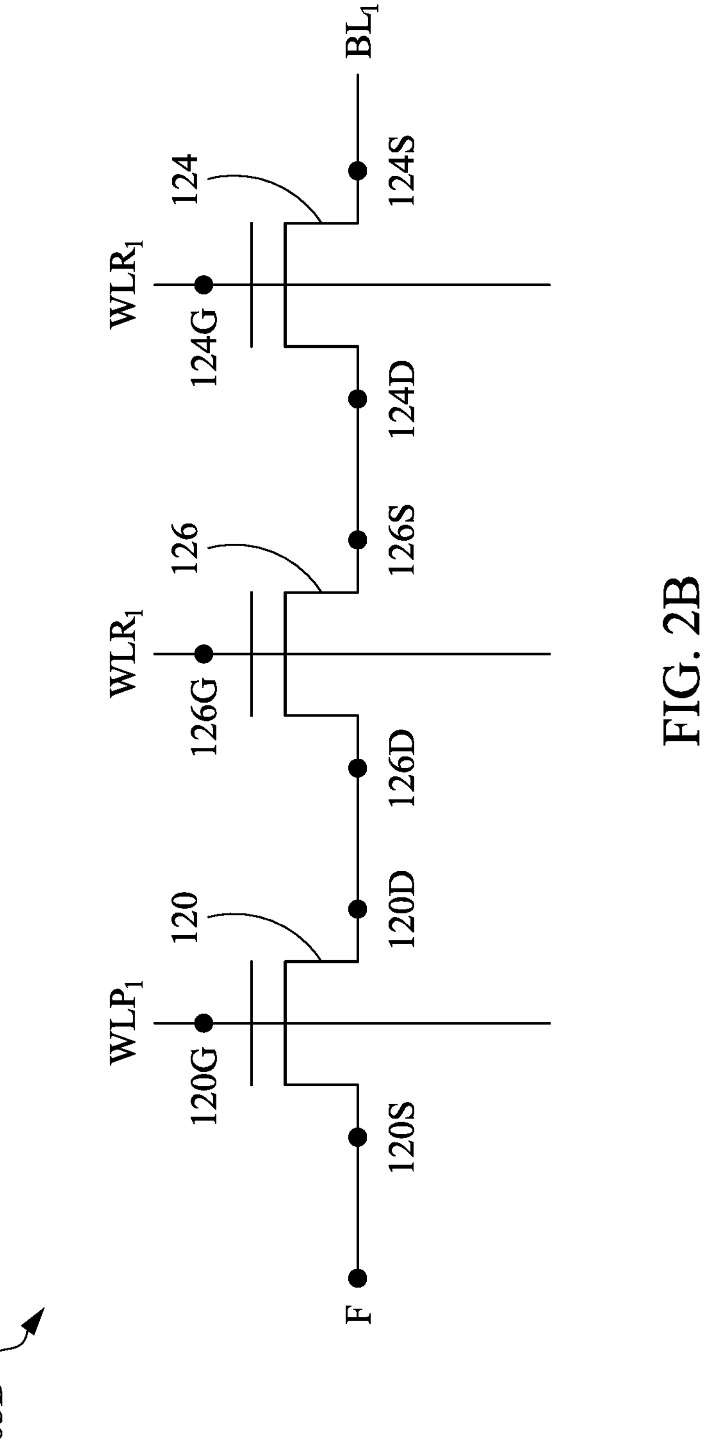
FIG. 2B illustrates an example circuit diagram of an anti-fuse memory cell of the memory device of FIGS. 1A and 1B in accordance with other embodiments.

FIG. 2B illustrates an example circuit diagram of an anti-fuse memory cell 103A of the memory device of FIGS. 1A and 1B in accordance with other embodiments. The anti-fuse memory cell 103A as shown in FIG. 2B is also implemented as a 3T configuration, but with some difference from the anti-fuse memory cell 103A as shown in FIG. 2A.

As shown in FIG. 2B, in some embodiments, the anti-fuse memory cell 103A includes a programming transistor 120, a first reading transistor 124, and a second reading transistor 126, in which the second reading transistor 126 is electrically coupled between the first reading transistor 124 and the programming transistor 120 in series. The programming transistor 120 is gated by the $WLP_1$, and the first reading transistor 124 and the second reading transistor 126 are commonly gated by the $WLR_1$.

Also as shown in FIG. 2B, in some embodiments, a source/drain terminal 126S of the second reading transistor 126 is coupled to a source/drain terminal 124D of the first reading transistors 124, and the other source/drain terminal 126D of the second reading transistor 126 is coupled to a source/drain terminal 120D of the programing transistor 120. In some embodiments, the other source/drain terminal 124S of the first reading transistor 124 is coupled to the bit line $BL_1$, and the other source/drain terminal 120S of the programming transistor 120 is floating.

Figure 2C:
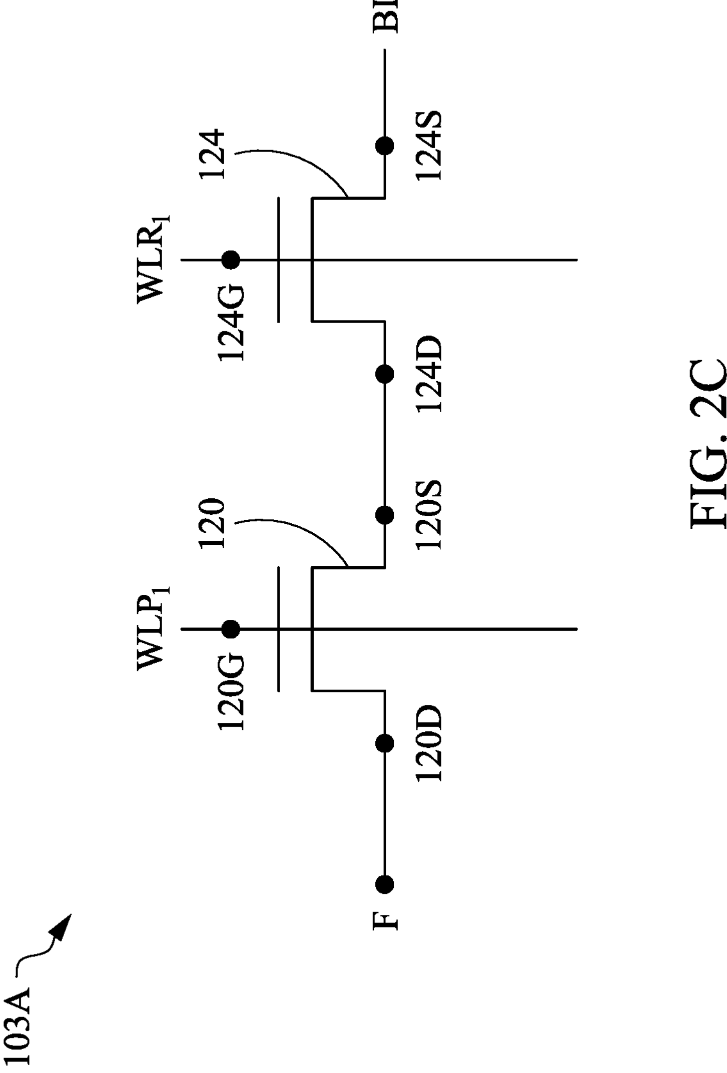
FIG. 2C illustrates an example circuit diagram of an anti-fuse memory cell of the memory device of FIGS. 1A and 1B in accordance with yet other embodiments.

FIG. 2C illustrates an example circuit diagram of an anti-fuse memory cell 103A of the memory device of FIGS. 1A and 1B in accordance with yet other embodiments. Different from the anti-fuse memory cell 103A as shown in FIGS. 2A and 2B, the anti-fuse memory cell 103A as shown in FIG. 2C is implemented as a two-transistor (2T) configuration.

As shown in FIG. 2C, in some embodiments, the anti-fuse memory cell 103A includes a programming transistor 120 and a first reading transistor 124 coupled in series, in which the programming transistor 120 is gated by the $WLP_1$, and the first reading transistor 124 is gated by the $WLR_1$. In some embodiments, a source/drain terminal 120S of the programming transistor 120 is coupled to a source/drain terminal 124D of the first reading transistors 124, the other source/drain terminal 124S of the first reading transistor 124 is coupled to the bit line $BL_1$, and the other source/drain terminal 120D of the programming transistor 120 is floating.

Figure 3B:
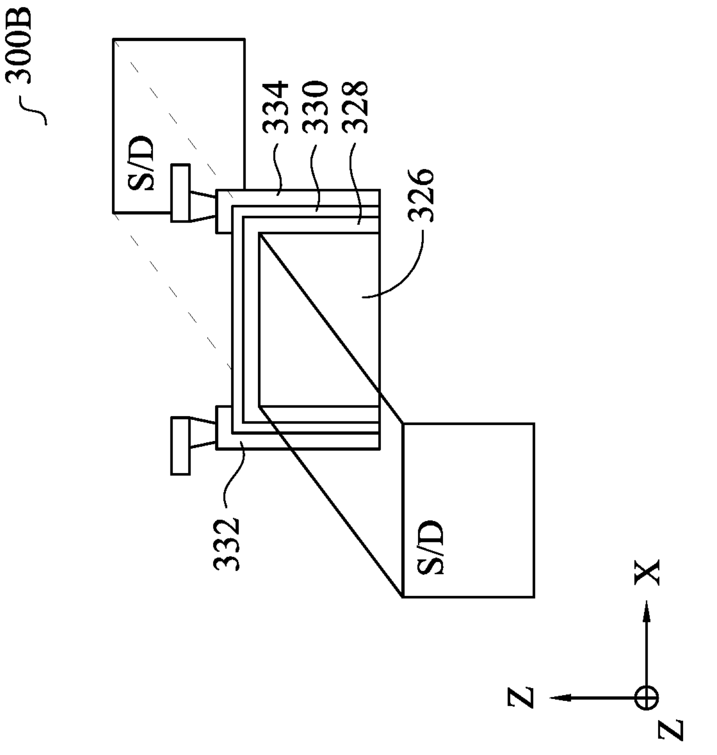
FIG. 3B illustrates an example diagram of an access transistor of a memory cell of FIGS. 2A-2C in accordance with other embodiments.
Figure 3A:
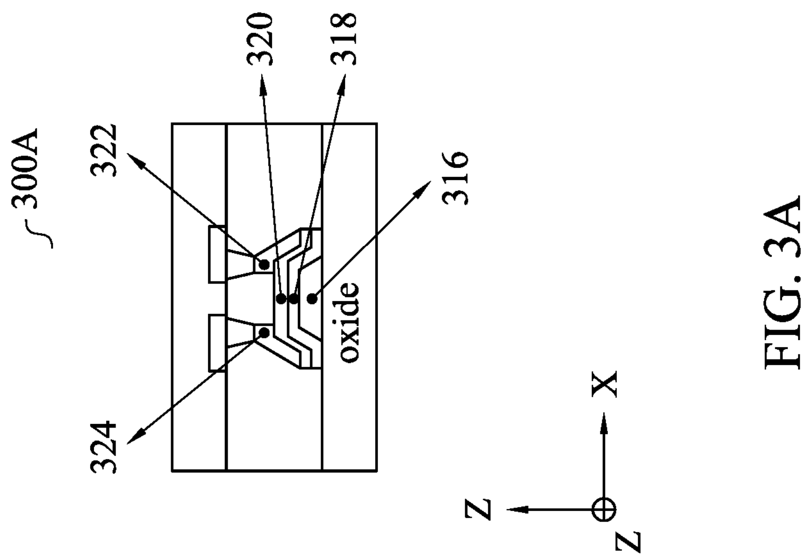
FIG. 3A illustrates an example diagram of an access transistor of a memory cell of FIGS. 2A-2C in accordance with some embodiments.

FIG. 3A illustrates an example diagram of an access transistor 300A of a memory cell 103A of FIGS. 2A-2C in accordance with some embodiments. The access transistor 300A as shown in FIG. 3A can be implemented as any one of a programming transistor 120, a first reading transistor 124, and a second reading transistor 126 as shown in FIGS. 2A-2C.

As shown in FIG. 3A, in some embodiments, the access transistor 300A includes a bottom gate 316, a gate dielectric 318 disposed over the bottom gate 316, a channel structure 320 disposed over the gate dielectric 318, and a pair of source/drain structures 322 and 324 disposed over the channel structure 320. The access transistor 300A can be referred to as a "two-dimensional back-gate transistor" or "2D transistor." The term "two-dimensional back-gate transistor" may refer to a transistor having its gate formed as a relatively planar or thinner structure and its channel structure contacting a top surface of its gate. In some embodiments, the bottom gate 316 includes TiN, the gate dielectric 318 includes a high-K dielectric material (such as $HfO_2$), the channel structure 320 includes InGaZnO (IGZO), and the source/drain structures 322 and 324 includes TiN.

FIG. 3B illustrates an example diagram of an access transistor 300B of a memory cell 103A of FIGS. 2A-2C in accordance with other embodiments. The access transistor 300B as shown in FIG. 3B can be implemented as any one of a programming transistor 120, a first reading transistor 124, and a second reading transistor 126 as shown in FIGS. 2A-2C.

As shown in FIG. 3B, in some embodiments, the access transistor 300B includes a bottom gate 326, a gate dielectric 328 disposed over the bottom gate 326, a channel structure 330 disposed over the gate dielectric 328, and a pair of source/drain structures 332 and 334 disposed over the channel structure 330. The access transistor 300B can be referred to as a "three-dimensional back-gate transistor" or "3D transistor." The term "three-dimensional back-gate transistor" may refer to a transistor having its gate formed as a relatively protruding structure and its channel structure contacting multiple surfaces of its gate. In some embodiments, the bottom gate 326 includes TiN, the gate dielectric 328 includes a high-K dielectric material (such as $HfO_2$), the channel structure 330 includes InGaZnO (IGZO), and the source/drain structures 332 and 334 includes TiN.

Figure 4:
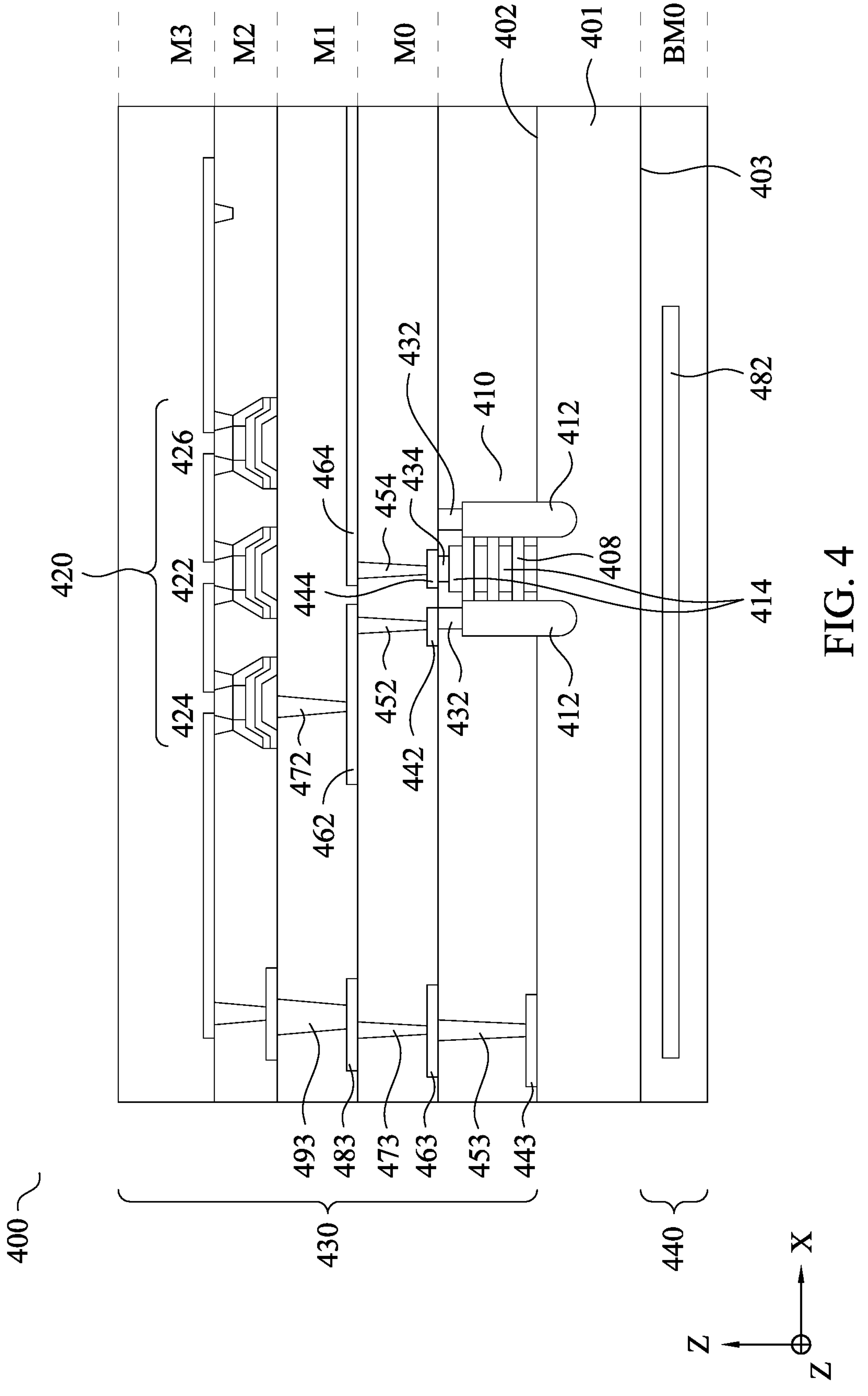
FIGS. 4, 5 and 6 illustrate various cross-sectional views of memory devices in accordance with some embodiments.
Figure 5:
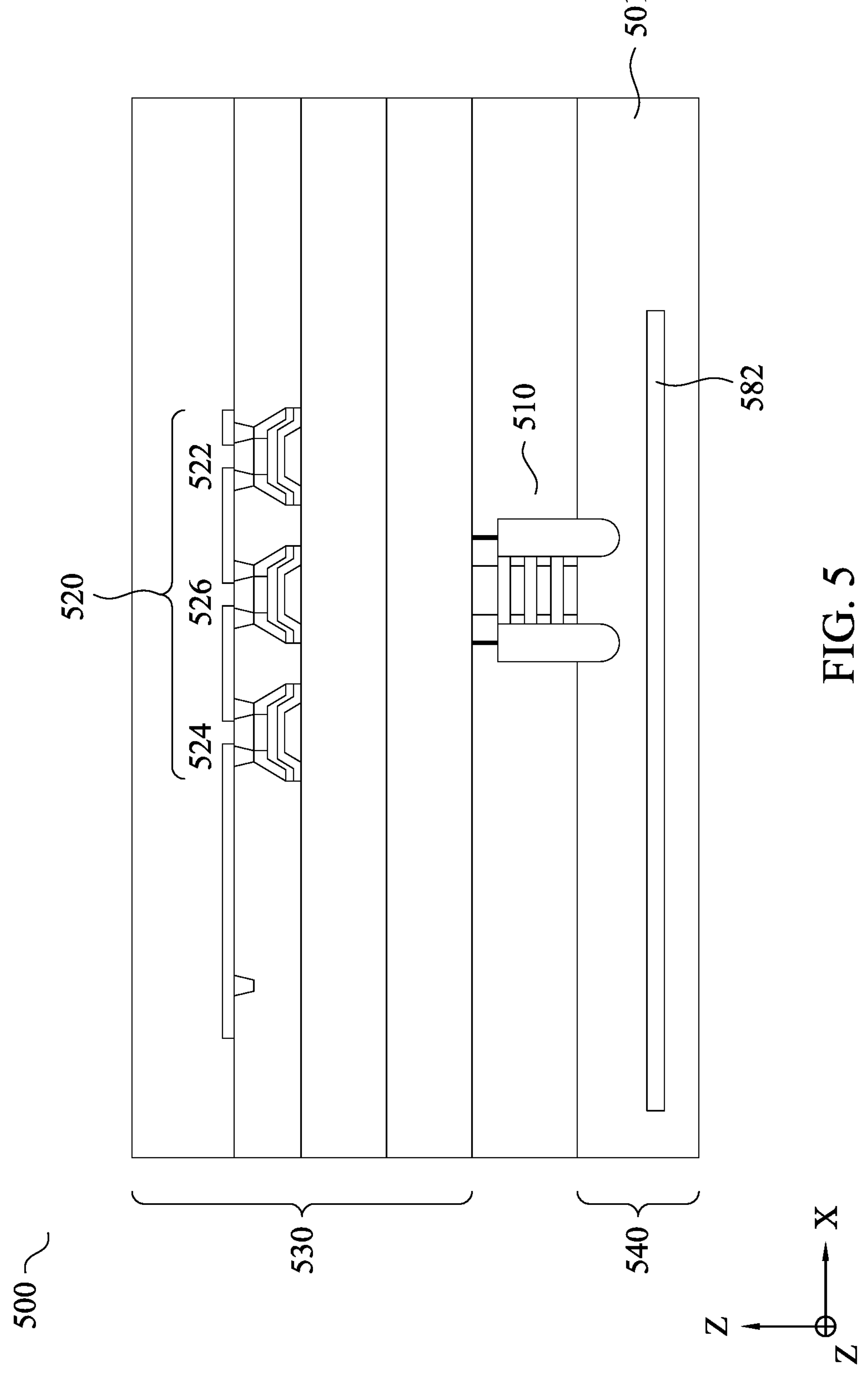
Figure 6:
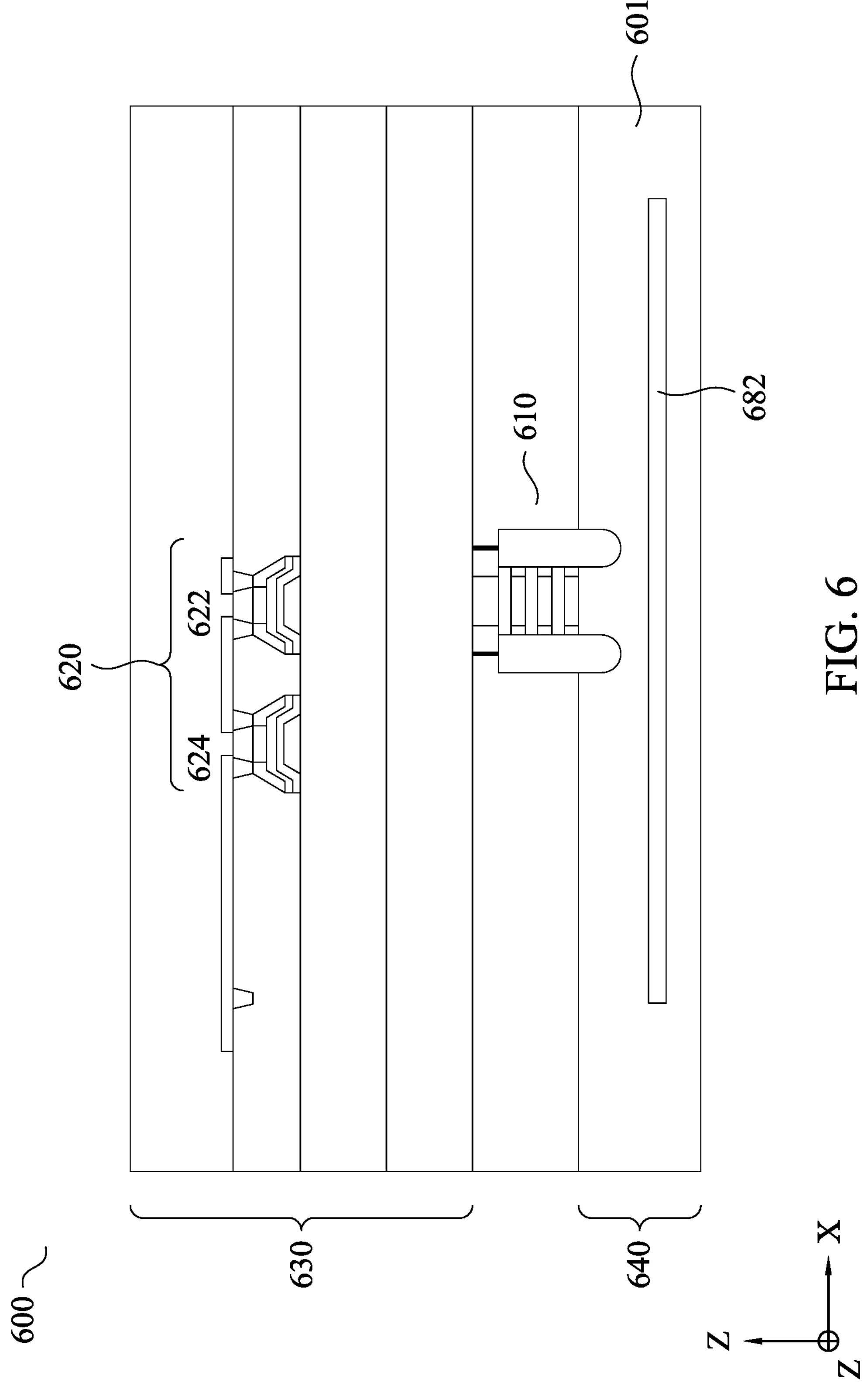
Figure 7:
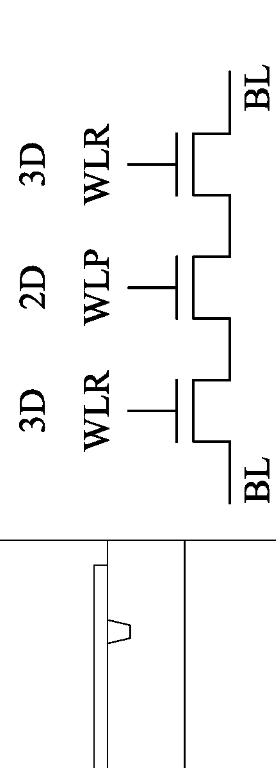
FIGS. 7, 8 and 9 illustrate various cross-sectional views of memory devices in accordance with other embodiments.
Figure 7:
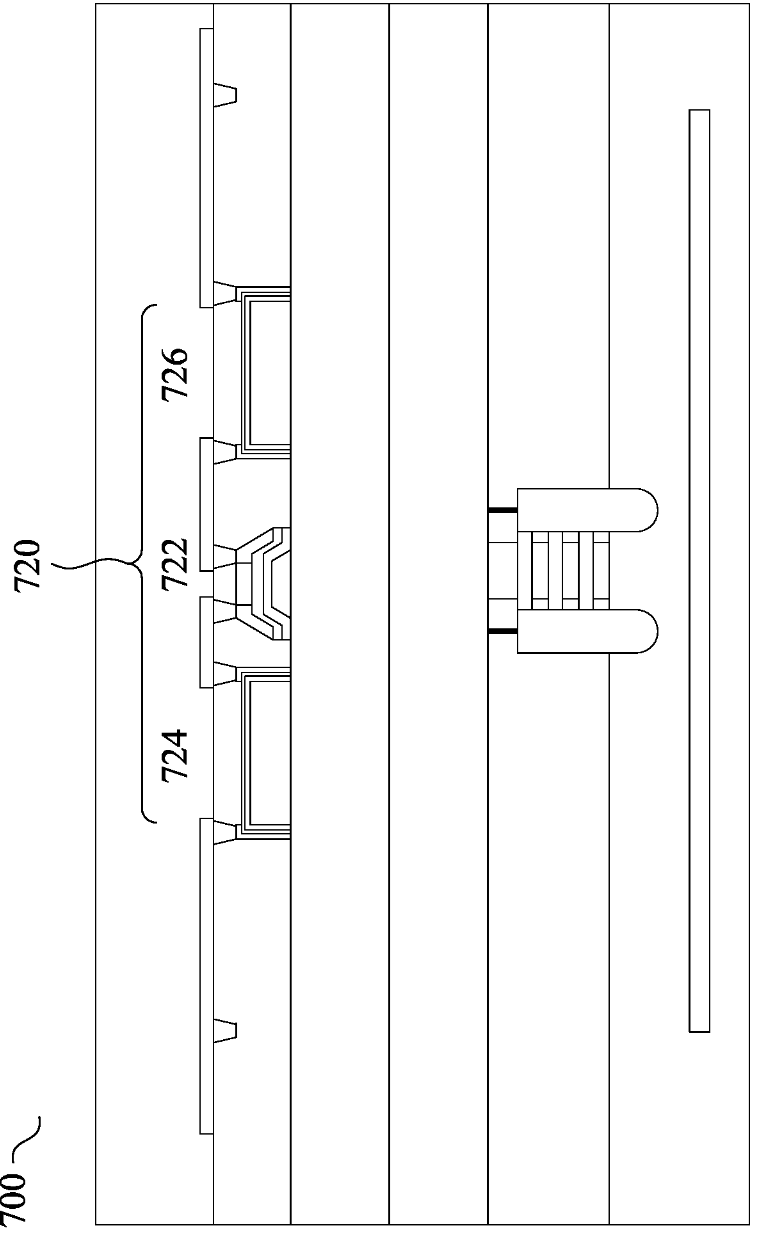
Figure 7:
Figure 8:
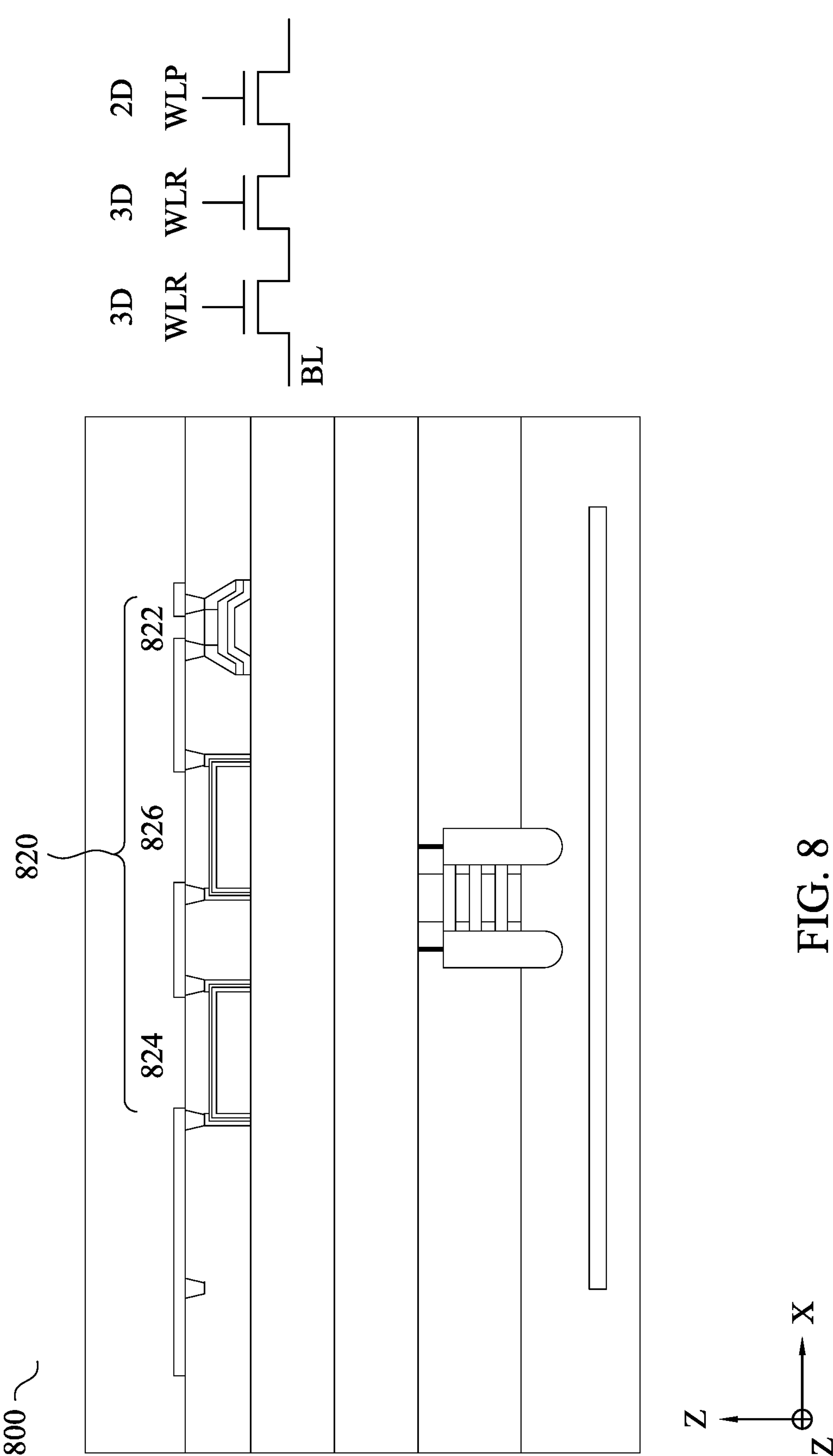
Figure 9:
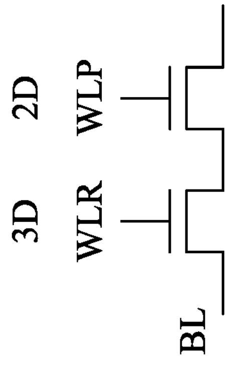
Figure 9:
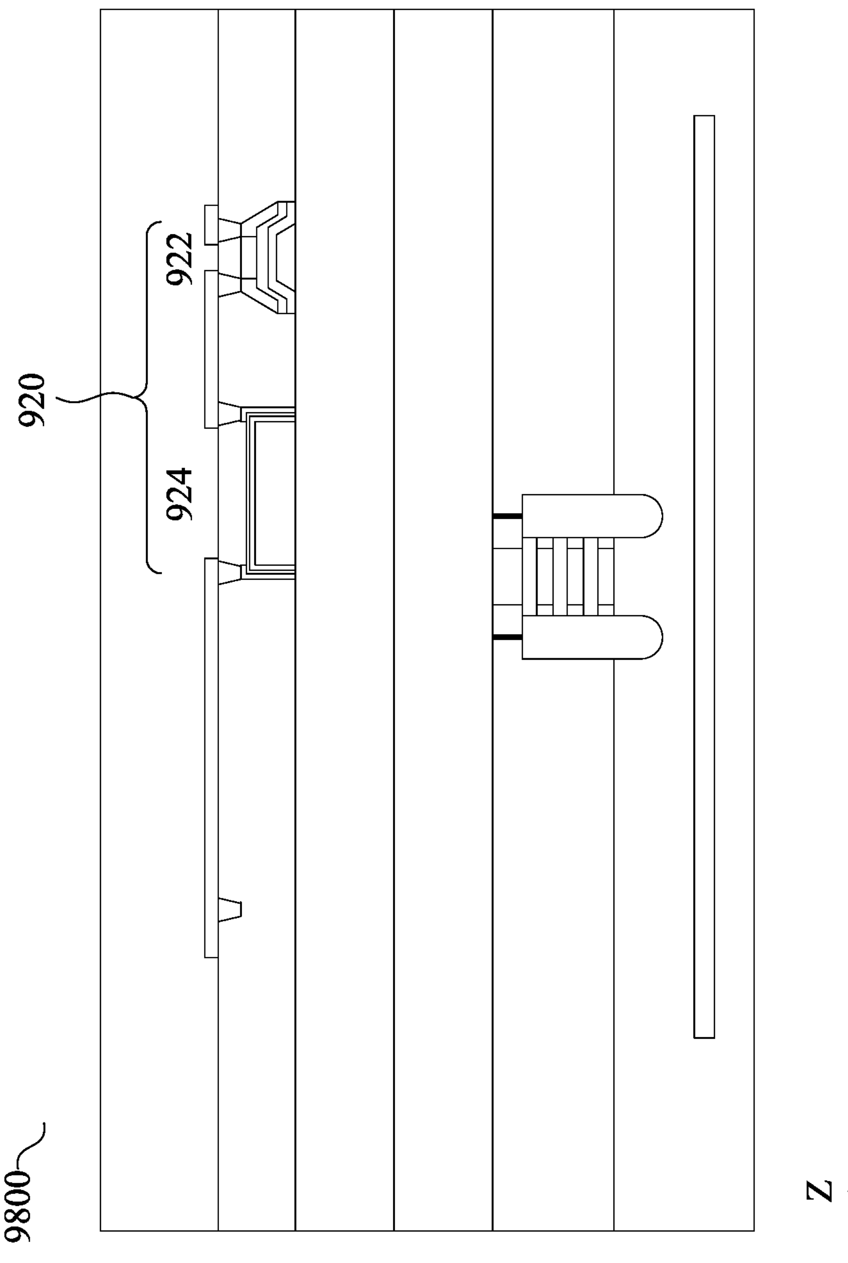
Figure 9:
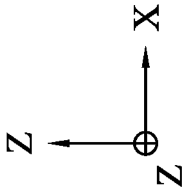

In some embodiments, the programming transistor and the one or more reading transistors in a memory cell are all implemented as a single type of transistors (such as 2D transistors 300A) (as shown in FIGS. 4, 5 and 6). In other embodiments, the programming transistor and the one or more reading transistors in a memory cell are implemented as a combination of different types of transistors (such as 2D and 3D transistors) (as shown in FIGS. 7, 8 and 9). Details about the arrangements and configurations of the programming transistor and the one or more reading transistors in a memory cell of a memory device will be explained with respect to FIGS. 4-9.

FIGS. 4, 5 and 6 illustrate respective cross-sectional views of memory devices 400, 500 and 600, each including an anti-fuse memory cell (corresponding to 103A as shown in FIGS. 2A-2C) including a programming transistor and one or more reading transistors (corresponding to 120 and 124/126 as shown in FIGS. 2A-2C) implemented as a single type (e.g., 2D type transistors as shown in FIG. 3A) in accordance with some embodiments of the present disclosure. FIGS. 4, 5 and 6 are simplified to illustrate configurations and relatively spatial arrangements of the related features and structures. Thus, it should be understood that the memory devices 400, 500 and 600 can each include one or more other features and structures, while remaining within the scope of the present disclosure. With such configurations and arrangements, the memory devices 400, 500 and 600 can advantageously get increased reading window.

Referring to FIG. 4, in some embodiments, a memory device 400 includes a substrate 401 having a first surface (or frontside) 402 and a second surface (or backside) 403 opposite to the first surface 402, a plurality of peripheral transistors (e.g., a peripheral transistor 410) formed along the first surface 402 of the substrate 401, a plurality of first metallization layers 430 (such as $M_0$, $M_1$, $M_2$, $M_3$ . . . ) disposed over the first surface 402, a plurality of anti-fuse memory cells (e.g., an anti-fuse memory cell 420) formed in one or more of the plurality of first metallization layers 430, and a plurality of second metallization layers 440 (such as $BM_0$) disposed over the second surface 403 of the substrate 401. In some embodiments, the anti-fuse memory cell 420 is operatively coupled to one or more peripheral transistors (such as 410), and is operatively coupled to a bit line (BL) 482 formed in a corresponding one (e.g., $BM_0$) of the second metallization layers 440 formed over the second surface 403 of the substrate 401.

In some embodiments, the peripheral transistor 410 is implemented as a Gate-All-Around FET (GAA FET). However, it should be understood that the peripheral transistor 410 can be implemented as any of various other types of transistor structures, while remaining within the scope of the present disclosure. In some embodiments, the peripheral transistor 410 includes a channel structure 408, source/drain structures 412, and an active (e.g., metal) gate structure 414. The channel 408 includes one or more nanostructures (e.g., nanosheets, nanowires) vertically spaced apart from each other along the Z-direction. The metal gate structure 414 wraps around each of the nanostructures of the channel structure 408, with the source/drain structures 412 coupled to the ends of the channel structure 408 along the X-direction.

The peripheral transistor 410 may further include a number of middle-end conductor (e.g., metal) structures, and each of the middle-end conductor structures can provide an electrical connection path for the corresponding gate structure 414 or the source/drain structures 412. For example, the peripheral device 410 includes middle-end conductor structures 432 and 434. The middle-end conductor structure 434 is formed as a via structure and in electrical contact with the gate structure 414 (sometimes referred to as "VG"), and the middle-end conductor structure 432 is formed as a via structure and in electrical contact with a source/drain structure 412 (sometimes referred to as "MD"). Hereinafter, the peripheral transistor 410 is referred to as being formed in a Front-End-Of-Line (FEOL) network.

Over the middle-end interconnect structures (e.g., VG and MD), the memory device 400 may further include a number of frontside metallization layers, e.g., M0, M1, M2, etc. Each of the metallization layers includes a number of backend conductor structures such as, for example, metal lines and via structures, embedded in a corresponding dielectric material (e.g., an IMD or ILD). The IMD/ILD may include one or more of a low-k dielectric layer (i.e., a dielectric with a dielectric constant less than about 3.9), an ultra low-k dielectric layer, or an oxide (e.g., silicon oxide).

Also as shown in FIG. 4, the memory device 400 includes multiple frontside metallization layers such as M0, M1, M2, and M3. Although four frontside metallization layers are shown, it should be understood that the memory device 400 can include any number of frontside metallization layers while remaining within the scope of the present disclosure. For example, the metallization layer M0 includes metal lines such as 442, 443 and 444 (sometimes referred to as "M0 tracks"), and via structures such as 452, 453 and 454 (sometimes referred to as "V0"); the metallization layer M1 includes metal lines such as 462, 463 and 464 (sometimes referred to as "M1 tracks"), and via structure such as 472 and 473 (sometimes referred to as "V1"); the metallization layer M2 includes metal lines such as 483 (sometimes referred to as "M2 tracks"), and via structures such as 493 (sometimes referred to as "V2") etc. In the illustrated example of FIG. 4, the anti-fuse memory cell 420 including three anti-fuse transistors 422, 424 and 426 is formed in the M2 layer. Hereinafter, the anti-fuse memory cell 420 is referred to as being formed in a Back-End-Of-Line (BEOL) network.

As shown in FIG. 4 and FIG. 2A, in some embodiments, the anti-fuse memory cell 420 in the BEOL network is implemented as a 3T configuration, and includes a first reading transistor 424, a second reading transistor 426, and a programming transistor 422 (respectively corresponding to transistors 124, 126 and 120 in FIG. 2A) coupled between the first reading transistor 424 and the second reading transistor 426 in series. In some embodiments, all of the programming transistor 422 and the first and the second reading transistors 424 and 426 are of the same type (e.g., 2D type transistors as shown in FIG. 3A).

Also as shown in FIG. 4 and FIG. 2A, the programming transistor 422 is in electrical connection between the first reading transistor 424 and the second reading transistor 426 in series, and both the first reading transistor 424 and the second reading transistor 426 is commonly in electrical connection with the bit line 482 that is formed in one of the second metallization layers 440 over the backside of the substrate.

Referring next to FIG. 5, the memory device 500 is similar to the memory device 400 as shown in FIG. 4. FIG. 5 is simplified to illustrate relatively spatial configurations of the above-discussed components and some structures and components are omitted. All of the programming transistor and the first and the second reading transistors are of the same type (e.g., 2D type as shown in FIG. 3A). The memory device 500 includes a plurality of peripheral transistors 510 formed along a first (frontside) surface of the substrate in a FEOL network, a plurality of first metallization layers 530 disposed over the first surface, a plurality of anti-fuse memory cells 520 formed in one or more of the plurality of first metallization layers in a BEOL network, and a plurality of second metallization layers 540 disposed over a second surface (backside) of the substrate opposite to the first surface. In some embodiments, the anti-fuse memory cell 520 is operatively coupled to one or more peripheral transistors 510, and is operatively coupled to a bit line (BL) 582 formed in one of the second metallization layers.

However, the configuration of the memory cell 520 (corresponding to memory cell 103A as shown in FIG. 2B) of the memory device 500 as shown in FIG. 5 is different from the configuration of the memory cell 420 (corresponding to memory cell 103A as shown in FIG. 2A) of the memory device 400 as shown in FIG. 4. In some embodiments, the anti-fuse memory cell 520 includes a first reading transistor 524, a programming transistor 522, and a second reading transistor 526 coupled between the first reading transistor 524 and the programming transistor 522 in series. In some embodiments, the first reading transistor 524 is in electrical connection with the bit line 582 formed in one of the second metallization layers over a backside of the substrate 501. In some embodiments, one of the source/drain terminals of the programming transistor 522 is floating.

Referring further next to FIG. 6, the memory device 600 is similar to the memory device 400 as shown in FIG. 4. FIG. 6 is simplified to illustrate relatively spatial configurations of the above-discussed components and some structures and components are omitted. The memory device 600 includes a plurality of peripheral transistors 610 formed along a first surface of a substrate 601, a plurality of first metallization layers 630 disposed over the first (frontside) surface, a plurality of anti-fuse memory cells 620 formed in one or more of the plurality of first metallization layers, and a plurality of second metallization layers 640 disposed over a second (backside) surface of the substrate opposite to the first surface. In some embodiments, the anti-fuse memory cell 620 is operatively coupled to one or more peripheral transistors 610, and is operatively coupled to a bit line (BL) 682 formed in one of the second metallization layers.

However, the configuration of the memory cell 620 (corresponding to memory cell 103A as shown in FIG. 2C) of the memory device 600 as shown in FIG. 6 is different from the configuration of the memory cell 420 (corresponding to memory cell 103A as shown in FIG. 2A) of the memory device 400 as shown in FIG. 4. In some embodiments, the anti-fuse memory cell 620 includes a first reading transistor 624 and a programming transistor 622 in series. In some embodiments, the first reading transistor 624 is in electrical connection with the bit line 682 formed in one of the second metallization layers. In some embodiments, one of the source/drain terminals of the programming transistor 622 is floating. Both of the programming transistor and the first reading transistor are implemented as the same type of transistors (e.g., 2D type transistors as shown in FIG. 3A).

FIGS. 7, 8 and 9 illustrate respective cross-sectional views of memory devices 700, 800 and 900, each including an anti-fuse memory cell (e.g., corresponding to 103A as shown in FIGS. 2A-2C) that includes a programming transistor and one or more reading transistors (e.g., corresponding to 120 and 124/126 as shown in FIGS. 2A-2C) of the different types (e.g., 2D and 3D transistors) in combination in accordance with other embodiments of the present disclosure. FIGS. 7, 8 and 9 are simplified to illustrate relatively spatial configurations of the above-discussed components and some structures and components are omitted.

Embodiments as shown in FIGS. 7, 8 and 9 are similar to embodiments as shown in FIGS. 4, 5 and 6 except that the programming transistor and the one or more reading transistors are implemented as using different types (such as 2D type and 3D type) of transistors in combination. In some embodiments, the programming transistor is formed as a 2D transistor, and the one or more reading transistors are formed as 3D transistors in combination. Thus, the reading transistors of the memory devices can advantageously obtain faster reading speed.

Referring to FIG. 7, the memory device 700 is similar to the memory device 400 as shown in FIG. 4 except that the configuration of three-transistor (3T) memory cell 720 of the memory device 700 is different from that of the 3T memory cell 420 as shown in FIG. 4. In some embodiments, the 3T memory cell 720 includes a first reading transistor 724 and a second reading transistor 726 configured as 3D type transistors (as shown in FIG. 3B), and a programming transistor 722 configured as a 2D type transistor (as shown in FIG. 3A) coupled between the first reading transistor 724 and the second reading transistor 726 in series.

Referring next to FIG. 8, the memory device 800 is similar to the memory device 700 as shown in FIG. 7 except that in a 3T memory cell 820, a 3D second reading transistor 826 is coupled between a 3D first reading transistor 824 and a 2D programming transistor 822 in series. Referring further to FIG. 9, the memory device 900 is similar to the memory device 600 as shown in FIG. 6 except that the configuration of the 2T memory cell 920 of the memory device 900 is different from that of the 2T memory cell 620 as shown in FIG. 6. In some embodiments, the 2T anti-fuse memory cell 920 includes a 3D first reading transistor 924 and a 2D programming transistor 922.

Figure 10:
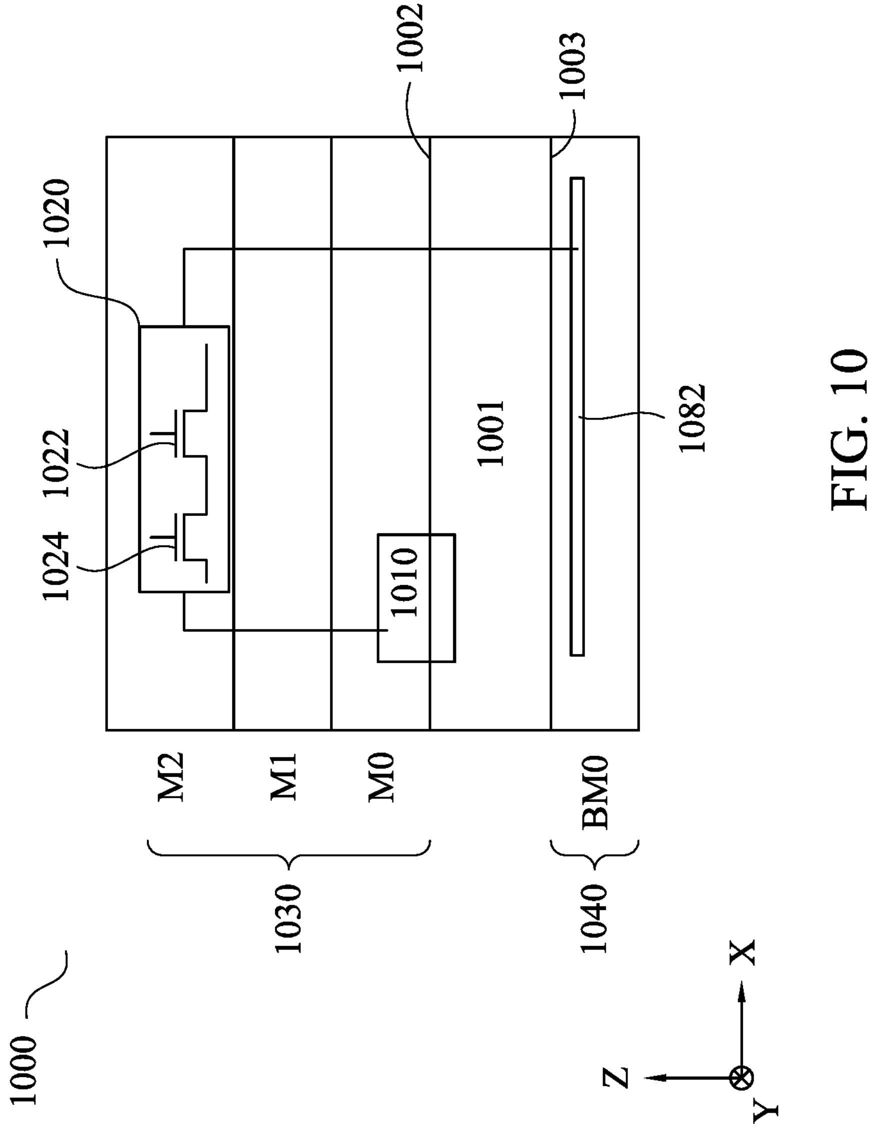
FIG. 10 illustrates a block diagram view of a memory device in accordance with some embodiments.

FIG. 10 illustrates a block diagram view of a memory device 1000 including anti-fuse memory cells (such as 1020) each including a programming transistor and one or more reading transistors (as shown in FIGS. 5-9) in accordance with some embodiments. FIG. 10 is simplified to illustrate relatively spatial configurations of the above-discussed components. Thus, it should be understood that the memory device 1000 can include one or more other features and structures, while remaining within the scope of the present disclosure.

As shown in FIG. 10, the memory device 1000 includes at least one peripheral transistor (such as a GAA FET 1010) formed along a major front surface 1002 of a substrate 1001 in a FEOL network, at least one anti-fuse memory cell 1020 each including a programming transistor and at least one reading transistor (such as 1022 and 1024) formed in a BEOL network over the FEOL network. The peripheral transistor 1010 can operatively serve as a function or control circuit (e.g., corresponding to row decoders 104, column decoders 106, I/O circuit 108, and control logic circuit 112 as shown in FIG. 1A) for the anti-fuse memory cell 1020. The programming transistor 1022 and the at least one reading transistor 1024 of the anti-fuse memory cell 1020 are both formed in one of a plurality of frontside metallization layers formed in the BEOL network. For example, the programming transistor 1022 and the reading transistor 1024 are both formed in the frontside metallization layer M2 (as shown in FIG. 4). In some embodiments, the anti-fuse memory cell 1020 is operatively coupled to a bit line (BL) 1082, which is formed in one or more of a plurality of backside metallization layers (e.g., BM0, BM1, MB2 . . . as shown in FIG. 4) disposed over a backside surface 1003 of the substrate 1001. For example, as shown in FIG. 10, the bit line 1082 is formed in the backside metallization layer BM0. In this way, among other things, the area of the memory device 1000 can be advantageously reduced.

In some embodiments, all of the programming transistor 1402 and the at least one reading transistor 1404 may be configured as 2D back-gate transistors (as shown in FIGS. 4-6). In other embodiments, the programming transistor 1402 may be configured as a combination of 2D and 3D back-gate transistors (as shown in FIGS. 7-9).

Figure 11:
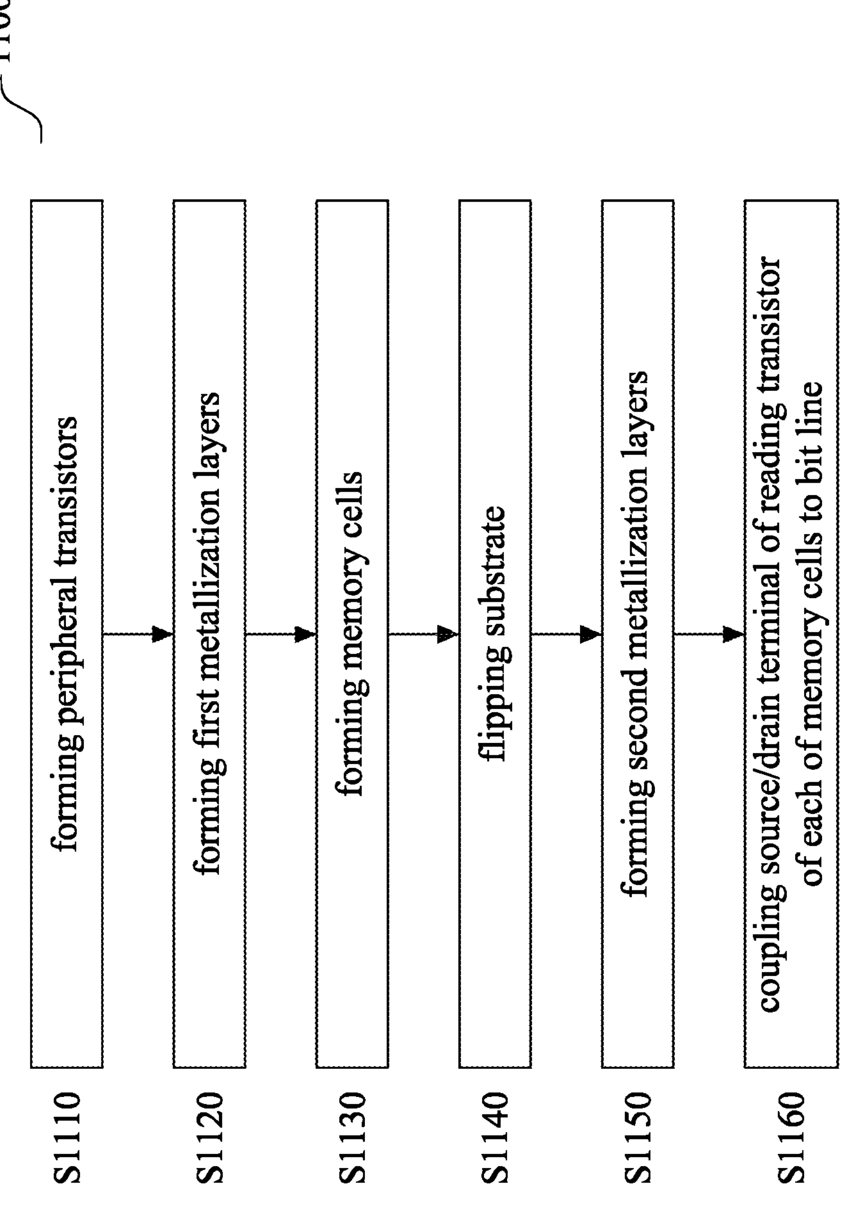
FIG. 11 illustrates a flow chart of a method of fabricating the memory device of FIG. 10 in accordance with some embodiments.

FIG. 11 illustrates a flow chart of a method 1100 of fabricating a memory device as shown in FIG. 10 in accordance with some embodiments. It is understood that additional operations can be provided before, during, and after processes discussed in FIG. 11, and some of the operations described below can be replaced or eliminated, for additional embodiments of the method. The order of the operations/processes may be interchangeable and at least some of the operations or processes may be performed in a different sequence. In some embodiments, at least two or more operations or processes are performed overlapping in time, or almost simultaneously.

In operation S1110, as shown in FIG. 10 and FIG. 11, a plurality of peripheral transistors (such as 1010) are formed along a first surface (frontside) 1002 of a substrate 1001 in a FEOL network. Various methods of oxidation, photolithography, deposition, and etching for example can be used to form the plurality of peripheral transistors 1010.

In some embodiments, the substrate includes a single crystalline semiconductor layer on at least its surface portion. The substrate may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 1001 is silicon wafer. The substrate may include in its surface region, one or more buffer layers (not shown). The buffer layers can serve to gradually change the lattice constant from that of the substrate to that of the source/drain regions.

In operation S1120, as shown in FIG. 10 and FIG. 11, a plurality of first metallization layers 1030 (e.g., M0, M1, M2 as shown in FIG. 4) are stacked over the first surface 1002 of the substrate 1001 in a BEOL network. Such metallization layers 1030, as parts of a BEOL network, each including a number of metal structures (such as metal lines or vias) embedded in an inter-layer dielectric (ILD) or inter-metal dielectric (IMD), are typically disposed over the major surface 1002 of the substrate 1001 on its front side.

In operation S1130, as shown in FIG. 10 and FIG. 11, a plurality of memory cells 1020 are formed in one of the plurality of first metallization layers 1030 in the BEOL network. For example, as shown in FIG. 10, a memory cell 1020 including a programming transistor 1022 and one reading transistor 1024 is formed in a metallization layer M2 of the plurality of first metallization layers 1030. Each memory cell 1020, as a part of the BEOL network, is operatively coupled to a subset (such as a peripheral transistor 1010) of the peripheral transistors, which is a part of the FEOL network. Referring to FIGS. 4-9, for example, there are various configurations of the memory cells based on the combination of the transistor types (such as 2D and 3D transistors), and there are various arrangements of the memory cells based on the spatial relations of the programming transistor and the one or more reading transistors in each memory cell.

In operation S1140, as shown in FIG. 10 and FIG. 11, the substrate 1001 is flipped such that various operations such as oxidation, photolithography, deposition, CMP, and etching (wet etching or dry etching) can be performed from a backside 1003 of the substrate 1001.

In operation S1150, as shown in FIG. 10 and FIG. 11, a plurality of second metallization layers 1040 (e.g., BM0, BM1, BM2 . . . ) can be formed over a second surface (backside) 1003 of the substrate 1001, which is opposite to the first surface 1002. As shown in FIG. 10 for example, a bit line BL 1082 is formed in a layer BM0 of the plurality of second metallization layers 1040 over the backside of the substrate 1001. Various methods such as oxidation, photolithography, deposition, and etching (wet etching or dry etching) can be used to form the plurality of second metallization layers 1040 over the backside of the substrate 1001.

In operation S1160, a source/drain terminal of the reading transistor of each of the memory cells formed over a frontside of the substrate is coupled to a bit line that is formed in a corresponding one (such as BM0) of the second metallization layers formed over a backside of the substrate, as shown in FIG. 4. In other embodiments, e.g., as shown in FIG. 2A, a source/drain terminal of the first reading transistor and a source/drain terminal of the second reading transistor of each memory cell are commonly coupled to the bit line, which is formed in a corresponding one of the second metallization layers over the backside of the substrate.

In some embodiments, as shown in FIG. 4, a source/drain terminal of a reading transistor (e.g., 424) of each of the memory cells 400 is coupled to the bit line 482 through a first via structure (e.g., 493), which extends along a vertical direction with a first width. In some embodiments, as shown in FIG. 4, the source/drain terminal of the reading transistor 424 of each of the memory cells 400 is coupled to the bit line 482 through a second via structure (e.g., 473), which extends along the vertical direction with a second width that is greater than the first width of the first via structure 493. The first via structure can save space in the memory device, while the second via structure can lead to reduced resistance in programming path. Various combinations and configurations of the via structures can be adjusted to reduce resistance in the programming path while saving the space of the memory device.

In the present disclosure, in some embodiments, a memory device includes a plurality of peripheral transistors formed along a frontside of a substrate in a FEOL network, a plurality of anti-fuse memory cells formed in one of a plurality of first metallization layers that are formed in a BEOL network over the FEOL network, and a plurality of bit lines formed in one of plurality of second metallization layers formed over a backside of the substrate opposite to the frontside. Each of the plurality of anti-fuse memory cells is operatively coupled to a subset of the plurality of peripheral transistors, and operatively coupled to a bit line of the plurality of bit lines. Each of the plurality of anti-fuse memory cells includes a programming transistor and one or more reading transistors. There are various connections, combinations, and configurations for the programming transistor and the one or more reading transistors in each of the plurality of anti-fuse memory cells based on such as the types (2D and 3D) of the transistors and the numbers of the transistors (such as 2T, 3T, or more T). Therefore, the space of the memory device can be advantageously reduced, and the reading speed of the memory can be advantageously increased, thereby leading to more compact chip design and more robust chip performance.

In one aspect of the present disclosure, a memory device is disclosed. The memory device includes a plurality of peripheral transistors formed along a first surface of a substrate; a plurality of memory cells formed in one or more of a plurality of first metallization layers disposed over the first surface; and a plurality of second metallization layers disposed over a second surface of the substrate opposite to the first surface. Each of the plurality of memory cells includes a programming transistor and at least a first reading transistor and is operatively coupled to a subset of the peripheral transistors. A first source/drain terminal of the programming transistor is in electrical connection with a first source/drain terminal of the first reading transistor, and a second source/drain terminal of the first reading transistor is in electrical connection with a bit line formed in a corresponding one of the second metallization layers.

In another aspect of the present disclosure, a memory device is disclosed. The memory device includes a memory cell that includes a programming transistor and a first reading transistor in electrical connection with the programming transistor in series and in electrical connection with a bit line. The memory cell is formed in one of a plurality of first metallization layers formed over a first surface of a substrate. The bit line is formed in one of a plurality of second metallization layers formed over a second surface of the substrate opposite to the first surface.

In yet another aspect of the present disclosure, a method for fabricating memory devices is disclosed. The method includes forming a plurality of peripheral transistors along a first surface of a substrate; forming a plurality of first metallization layers disposed over the first surface; forming a plurality of memory cells in one or more of the plurality of first metallization layers; flipping the substrate; forming a plurality of second metallization layers disposed over a second surface of the substrate opposite to the first surface; and coupling a source/drain terminal of the reading transistor of each of the memory cells to a bit line formed in a corresponding one of the second metallization layers. Each of the plurality of memory cells includes a programming transistor and at least a reading transistor and is operatively coupled to a subset of the peripheral transistors.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a plurality of peripheral transistors formed along a first surface of a substrate;

a plurality of memory cells formed in one or more of a plurality of first metallization layers disposed over the first surface, each of the plurality of memory cells being operatively coupled to a subset of the peripheral transistors and comprising a programming transistor and at least a first reading transistor; and a plurality of second metallization layers disposed over a second surface of the substrate opposite to the first surface;

wherein a first source/drain terminal of the programming transistor is in electrical connection with a first source/drain terminal of the first reading transistor, and a second source/drain terminal of the first reading transistor is in electrical connection with a bit line formed in a corresponding one of the second metallization layers.

2. The memory device of claim 1, wherein each of the memory cells operatively serves as an anti-fuse memory cell, in which a gate dielectric of the programming transistor is configured to be permanently broken down.

3. The memory device of claim 1, wherein a second source/drain terminal of the programming transistor is floating.

4. The memory device of claim 1, wherein each of the programming transistor and the first reading transistor has a semiconductive-behaving material as its channel.

5. The memory device of claim 4, wherein the semiconductive-behaving material is formed in a corresponding one of the first metallization layers and formed as a two-dimensional film.

6. The memory device of claim 4, wherein the semiconductive-behaving material is formed in a corresponding one of the first metallization layers and formed as a three-dimensional structure.

7. The memory device of claim 1, wherein the subset of the peripheral transistors include a first peripheral transistor and a second peripheral transistor that are operatively coupled to a gate terminal of the programming transistor and a gate terminal of the first reading transistor, respectively.

8. The memory device of claim 1, wherein each of the memory cells further comprising a second reading transistor electrically connected to the programming transistor and the first reading transistor in series.

9. The memory device of claim 8, wherein the programming transistor is laterally interposed between the first reading transistor and the second reading transistor.

10. The memory device of claim 8, wherein the second reading transistor is laterally interposed between the first reading transistor and the programming transistor.

11. A memory device, comprising:

a memory cell comprising:

a programming transistor; and a first reading transistor in electrical connection with the programming transistor in series and in electrical connection with a bit line;

wherein the memory cell is formed in one of a plurality of first metallization layers formed over a first surface of a substrate;

wherein the memory cell is operatively coupled to a subset of a plurality of peripheral transistors formed along the first surface of the substrate; and wherein the bit line is formed in one of a plurality of second metallization layers formed over a second surface of the substrate opposite to the first surface.

12. The memory device of claim 11, wherein the memory cell operatively serves as an anti-fuse memory cell, in which a gate dielectric of the programming transistor is configured to be permanently broken down.

13. The memory device of claim 11, wherein each of the programming transistor and the first reading transistor has a semiconductive-behaving material as a channel thereof.

14. The memory device of claim 11, wherein the memory cell further comprises a second reading transistor in electrical connection with the programming transistor and the first reading transistor in series.

15. The memory device of claim 14, wherein the programming transistor is electrically connected between the first reading transistor and the second reading transistor.

16. The memory device of claim 14, wherein the second reading transistor is electrically connected between the first reading transistor and the programming transistor.

17. A method for forming memory devices, comprising:

forming a plurality of peripheral transistors along a first surface of a substrate;

forming a plurality of first metallization layers disposed over the first surface;

forming a plurality of memory cells in one or more of the plurality of first metallization layers, wherein each of the plurality of memory cells is operatively coupled to a subset of the peripheral transistors and comprises a programming transistor and at least a reading transistor;

forming a plurality of second metallization layers disposed over a second surface of the substrate opposite to the first surface; and coupling a source/drain terminal of the reading transistor of each of the memory cells to a bit line formed in a corresponding one of the second metallization layers.

18. The method of claim 17, wherein the source/drain terminal of the reading transistor of each of the memory cells is coupled to the bit line by a first via structure, the first via structure extending along a lateral direction with a first width.

19. The method of claim 18, wherein the source/drain terminal of the reading transistor of each of the memory cells is coupled to the bit line further by a second via structure, the second via structure extending along the lateral direction with a second width that is substantially greater than the first width.

20. The method of claim 17, wherein each of the memory cells includes a plurality of transistors connected in series, and wherein each of the plurality of transistors has a semiconductive-behaving material as its channel.

* * * * *